United States Patent [19]

Kamiya

[11] 4,348,644
[45] Sep. 7, 1982

[54] POWER AMPLIFYING CIRCUIT WITH CHANGING MEANS FOR SUPPLY VOLTAGE

[75] Inventor: Shingo Kamiya, Hamamatsu, Japan

[73] Assignee: Nippon Gakki Seizo Kabushiki Kaisha, Hamamatsu, Japan

[21] Appl. No.: 133,360

[22] Filed: Mar. 24, 1980

[30] Foreign Application Priority Data

Sep. 14, 1979 [JP] Japan .................. 54-118029
Sep. 14, 1979 [JP] Japan .................. 54-118030

[51] Int. Cl.³ .................. H03F 3/21; H03F 3/26
[52] U.S. Cl. .................. 330/297; 330/263
[58] Field of Search .................. 330/262, 263, 297

[56] References Cited

U.S. PATENT DOCUMENTS 3,319,175  5/1967  Kramer .
3,466,527  9/1969  Chun .
3,506,905  4/1970  Thomas .
3,622,899  11/1971  Elsenberg .
3,723,849  3/1973  Ludloff .
3,961,280  6/1976  Sampei .
4,051,425  9/1977  Smith .
4,115,742  9/1978  Yokoyama .................. 330/297
4,218,660  8/1980  Carver .................. 330/263

FOREIGN PATENT DOCUMENTS 49-59451    5/1974  Japan .
50-45549    4/1975  Japan .
50-45550    4/1975  Japan .
50-141743  11/1975  Japan .

Primary Examiner—James B. Mullins
Assistant Examiner—Gene Wan
Attorney, Agent, or Firm—Cushman, Darby & Cushman

[57] ABSTRACT

A power amplifying circuit detects the crest factor of an electric signal, especially an audio signal, requiring amplification. In case this crest factor is great, the level of supply voltage for power amplifying elements of the power amplifying circuit is raised, and conversely in case the crest factor is small, the supply voltage level is lowered, thereby minimizing the development of distortions in the power amplifying elements as well as minimizing thermal loss thereof.

15 Claims, 9 Drawing Figures

POWER AMPLIFYING CIRCUIT WITH CHANGING MEANS FOR SUPPLY VOLTAGE

BACKGROUND OF THE INVENTION (a) Field of the Invention

The present invention pertains to a power amplifying circuit for use in amplifiers for driving speakers or like loads.

(b) Description of the Prior Art

Electric signals, especially musical signals, which require amplification have, in many cases, pulsive or steep waveshapes. However, power amplifying circuits are required to amplify the electric signals as faithfully as possible, i.e. without developing distortions due to clipping of the peak points of such pulsive waveshapes of the signals. To this end, conventional power amplifying circuits are designed so that the supply voltage which is to be applied to the power amplifying elements in the power amplifying circuit is fixed to a high voltage level relatively independent of the level of the electric signal to be amplified.

In case the level of the voltage which is supplied to the power amplifying elements is set to a high level, however, there entails the inconvenience that, in case, conversely, the electric signal is of a low level and has a gentle or blunt waveshape similar to a sinusoidal wave having a large energy, there arises an increased power loss and heat generation of the power amplifying elements. This would lead to destruction of these elements. An attempt to avoid this mode of destruction has required an uneconomically large-size heatsink.

SUMMARY OF THE INVENTION

It is, therefore, a primary object of the present invention to provide a power amplifying circuit which is capable of amplifying electrical signals while both minimizing distortion and reducing the power loss of power amplifying elements.

Another object of the present invention is to provide a power amplifying circuit described above, which thus can minimize the occurrence of destruction of the power amplifying elements employed and which allows an economically compact size heatsink to be incorporated in the circuit.

Still another object of the present invention is to provide a power amplifying circuit of the type described above, which attains the above-stated objects by the arrangement that detects the crest factor of an electric signal requiring amplification and controls the voltage to be supplied to the power amplifying elements in accordance with the crest factor thus detected.

A further object of the present invention is to provide a power amplifying circuit of the type described above, which controls of the supply voltage in a stepwise manner in accordance with the detected crest factor of an electric signal being amplified.

A still further object of the present invention is to provide a power amplifying circuit of the type described above, which, however, performs the control of the supply voltage continuously in accordance with the detected crest factor of an electric signal.

DETAILED DESCRIPTION OF THE PREFERRED EMBODIMENTS

Figure 1:
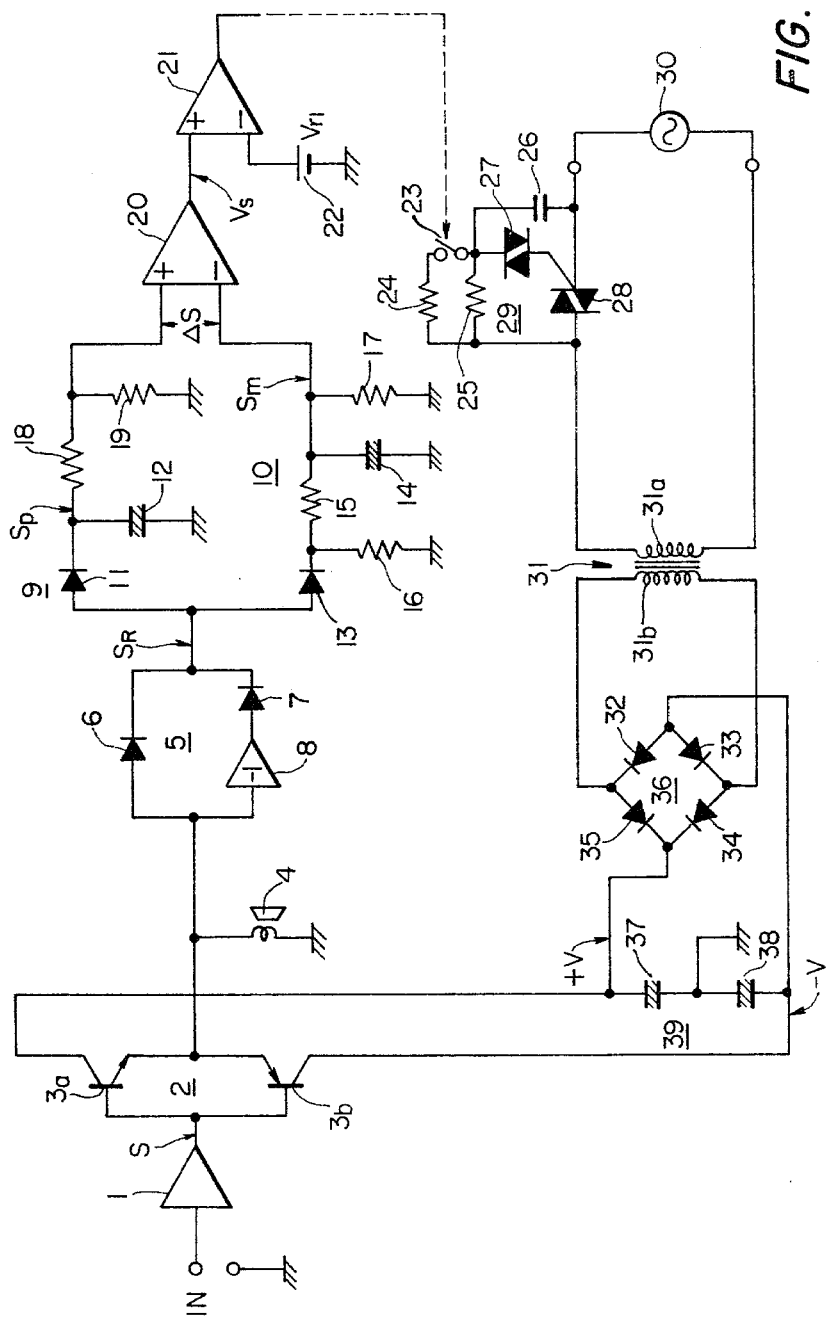
FIG. 1 is a circuit diagram of an embodiment of the power amplifying circuit according to the present invention.

FIG. 1 shows an embodiment of the power amplifying circuit according to the present invention. In FIG. 1, an electric signal S which is outputted from a drive circuit 1 of a voltage amplifying circuit of an electric apparatus is applied to the bases of power transistors 3a and 3b of a power amplifying circuit 2. The electric signal is power-amplified by these power transistors 3a and 3b, and is therefrom applied to a loud-speaker 4 and to a full-wave rectifying circuit 5.

The full-wave rectifying circuit 5 includes diodes 6 and 7 and an inverter 8, and performs full-wave rectification of the electric signal S supplied from the power amplifying circuit 2 and outputs a rectified signal $S_R$. This signal $S_R$ is delivered to a peak-value detecting circuit 9 and to a mean value detecting circuit 10. It should be understood that the rectifying circuit 5 is not limited to a full-wave rectifying circuit, but it may be a half-wave rectifying circuit.

The peak value detecting circuit 9 includes a diode 11 and a capacitor 12, and detects a peak value of the signal $S_R$ and outputs a corresponding peak value signal $S_P$. Mean value detecting circuit 10 includes a diode 13, a capacitor 14, and resistors 15–17, and it detects a mean value of the signal $S_R$, and outputs a mean value signal $S_m$ corresponding to this mean value.

Figure 2:
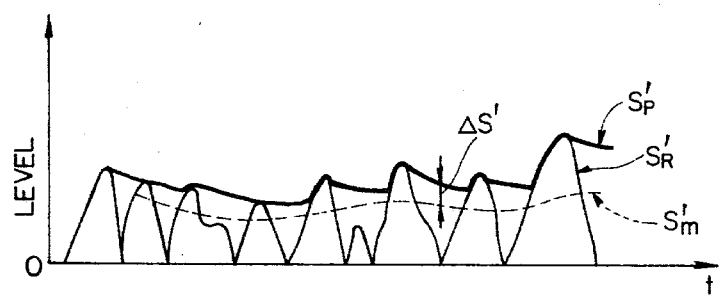
FIG. 2 is a diagram of waveshapes of an electric signal in various portions of the power amplifying circuit shown in FIG. 1 in case the electric signal has a waveshape similar to a sinusoidal wave.

Let us now suppose that the electric signal S is one having a gentle waveshape similar to a sinusoidal wave, and that the waveshape of the signal after the electric signal S has been rectified by the full-wave rectifying circuit 5 is such as is expressed by the signal waveshape $S'_R$ as shown in FIG. 2. The peak-value detecting circuit 9 outputs a peak value signal $S'_P$ (see FIG. 2) corresponding to the peak value of said signal $S'_R$. Also, the mean-value detecting circuit 10 outputs a mean value signal $S'_m$ corresponding to the mean value of said signal $S'_R$ as shown in FIG. 2. As will be understood from the respective signal waveshapes shown in FIG. 2, in case the electric signal S has a gentle waveshape similar to a sinusoidal wave, there is a small difference $\Delta S'$ in signal level between the peak value signal $S'_p$ and the mean value signal $S'_m$ of the electric signal S.

Figure 3:
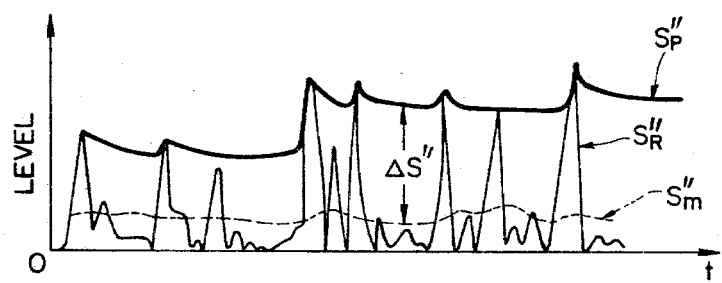
FIG. 3 is a diagram of waveshapes of an electric signal in various portions of the power amplifying circuit shown in FIG. 1 in case the electric signal has a pulsive waveshape.

On the other hand, let us here assume that the electric signal S is a musical signal having a pulsive waveshape, and that the waveshape of the signal after the electric signal S has been rectified by the full-wave rectifying circuit 5 is expressed by, for example, a signal waveshape $S''_R$ shown in FIG. 3. The peak value detecting circuit 9 outputs a peak value signal $S''_p$ (see FIG. 3) corresponding to a peak value of said signal $S''_R$. Also, the means value detecting circuit 10 outputs a mean value signal $S''_m$ (see FIG. 3) corresponding to a mean value of said signal $S''_R$. As will be clear from these respective signal waveshapes shown in FIG. 3, in case the electric signal S is one having a pulsive waveshape, the difference $\Delta S''$ in signal level between the peak value signal $S''_p$ and the mean value signal $S''_m$ becomes very great.

Accordingly, by detecting a difference $\Delta S$ in signal level between a peak value signal $S_P$ and a mean value signal $S_m$ of a rectified signal $S_R$, it is possible to identify whether the electric signal S is a signal having a waveshape like a sinusoidal wave or a pulsive signal like a musical signal.

The output signal $S_P$ of the peak value detecting circuit 9 is supplied to a non-inverting terminal of a differential amplifier 20 after being divided by resistors 18 and 19. Also, the output signal $S_m$ of the mean value detecting circuit 10 is applied to an inverting terminal of the differential amplifier 20. These dividing resistors 18 and 19 are intended to determine a threshold level of the comparing action of the differential amplifier 20.

The differential amplifier 20 outputs a differential voltage $V_s$ corresponding to the signal level difference $\Delta S$ between the peak value signal $S_P$ and the mean value signal $S_m$. This differential voltage $V_s$ is proportional to the crest factor of the electric signal S. It should be understood that the value of the signal level difference $\Delta S$ is set by adjusting the resistance values of these resistors 18 and 19 based on the signal level difference between the signal level difference $\Delta S'$ (see FIG. 2) and the signal level difference $\Delta S''$ (see FIG. 3) which have been mentioned above.

Referring again to FIG. 1, a comparator 21 is connected to an output side of the differential amplifier 20. To this comparator 21 is applied a reference voltage $V_{r1}$ by a reference voltage supply 22. Accordingly, this comparator 21 operates so that, in case the level of the output voltage $V_s$ of the differential amplifier 20 exceeds the reference voltage $V_{r1}$, it outputs a high level signal, causing a relay or like element to operate to close a normally open contact 23.

Resistors 24 and 25, a capacitor 26 and a triggering element 27 such as a triac jointly constitute a triggering circuit 29 for a bidirectional thyristor 28. The timing at which a triggering pulse is generated by this triggering circuit 29 is switched between two stages in accordance with the making and breaking of the contact 23. Let us here assume that the triggering phase angle is $\phi_a$ when the contact 23 is open, and that the triggering phase angle is $\phi_b$ when the contact 23 is closed. There is the relationship $\phi_a > \phi_b$ between them. That is, when the contact 23 is closed, the triggering angle of phase advances to $\phi_b$ to advance the timing for an ac voltage of an ac voltage supply 30 to pass through the bidirectional thyristor 28, to thereby supply a large amount of energy to a primary winding 31a of a power transformer 31.

A rectifying bridge circuit 36 which is formed with diodes 32–35 is connected to a secondary winding 31b of the power transformer 31. The voltage which is rectified by this bridge circuit 36 is then smoothed by a smoothing circuit 39 which includes capacitors 37 and 38. The smoothed voltage is applied, as dc output voltages $+V$ and $-V$, to collectors of the power transistors 3a and 3b of the power amplifying circuit 2.

The level of said dc output voltages $+V$ and $-V$ are determined by the timing at which the bidirectional thyristor 28 is rendered conductive. These voltages $+V$ and $-V$ increase greater for a smaller triggering phase angle. Accordingly, if the dc voltages are assumed to be $\pm V_a$ and $\pm V_b$ when the phase angle of the triggering pulse is $\phi_a$ and $\phi_b$, respectively, the relationship between $V_a$ and $V_b$ will be: $|V_a| < |V_b|$. It is needless to say that the difference in level of the voltages, $|\Delta V|$ (namely, $|V_b| - |V_a|$), is determined by the phase difference $\Delta \phi$ (namely, $\phi_b - \phi_a$).

As such, in case the electric signal S is a signal having a pulsive waveshape like a musical signal, the voltages supplied to the power transistors 3a and 3b will become high, being $\pm V_b$. Thus, these power transistors 3a and 3b will amplify the electric signal S faithfully up to a high voltage level. Moreover, in such instance, the mean value of the electric signal is relatively low, as stated previously, and therefore the power loss also will become low for such signal.

If, conversely, the electric signal S is one having a waveshape like a sinusoidal wave, and when the signal level difference $\Delta S$ between the peak value and the mean value becomes smaller than a predetermined value, the supply voltages for the power transistors 3a and 3b are changed to voltages $\pm V_a$ which are lower than the aforesaid voltages $\pm V_b$. Accordingly, despite that the mean value of the electric signal S is relatively high, it is possible to make the power losses of the power transistors 3a and 3b small, and thus it is possible to minimize thermal losses.

According to the present invention, power loss can be made small and thermal loss can be reduced as stated above, by changing the supply voltage to the power transistors 3a and 3b.

As described above, according to the power amplifying circuit shown in FIG. 1, the supply voltage for the power amplifying circuit can vary in accordance with the nature of an input signal waveshape. Accordingly, wasteful loss of power can be prevented from developing, and economical minimized heatsink can be allowed, and furthermore destruction of the output stage elements due to heat can be avoided. Also, because a compact heatsink can be employed, it is possible to construct a less expensive power amplifying circuit. Thus, the present invention has many advantages.

Figure 4:
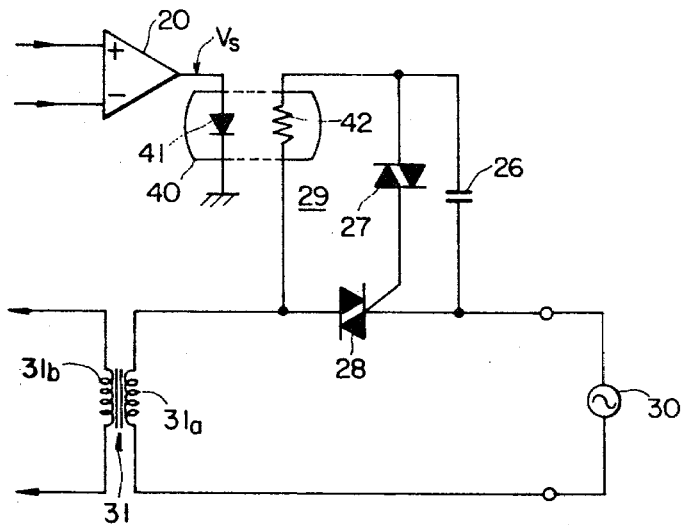
FIG. 4 is a circuit diagram showing a modification of the phase controlling section of the bidirectional thyristor employed in the power amplifying circuit shown in FIG. 1.

FIG. 4 is a partial modification of FIG. 1 for allowing continuous phase control of the bidirectional thyristor 28. Reference numerals similar to those employed in FIG. 1 indicate similar elements and parts. In FIG. 4, an output of the differential amplifier 20 is connected to a light-emitting element 41 of a photo-coupler 40. Also, a light-receiving element 42 of this photo-coupler 40 is capable of varying its internal resistance in reverse proportion to the brightness of the light emitting from the light-emitting element 41. This light-receiving element 42 is assigned to determine the triggering phase angle of the bidirectional thyristor 28. That is, this light-receiving element 42 is operative so that, in case its internal resistance increases, it serves so as to retard the triggering phase angle, whereas in case its internal resistance decreases, it advances the triggering phase angle. Accordingly, in case the signal level difference $\Delta S$ between the peak value signal $S_P$ and the mean value signal $S_m$ is large, the output voltage $V_s$ of the differential amplifier 20 is elevated. Therefore, the brightness of the light-emitting element 41 increases, so that the internal resistance of the light-receiving element 42 reduces. As a result, the triggering phase angle of the bidirectional thyristor 28 is advanced, and each level of dc output voltages $\pm V$ rises. Conversely, in case the aforesaid signal level $\Delta S$ is small, the triggering phase angle of the bidirectional thyristor 28 is retarded due to reverse actions of the elements, and thus each level of dc output voltages $\pm V$ becomes low. These levels of output dc voltages $\pm V$ continuously vary according to the nature of the electric signal waveshape.

Figure 5:
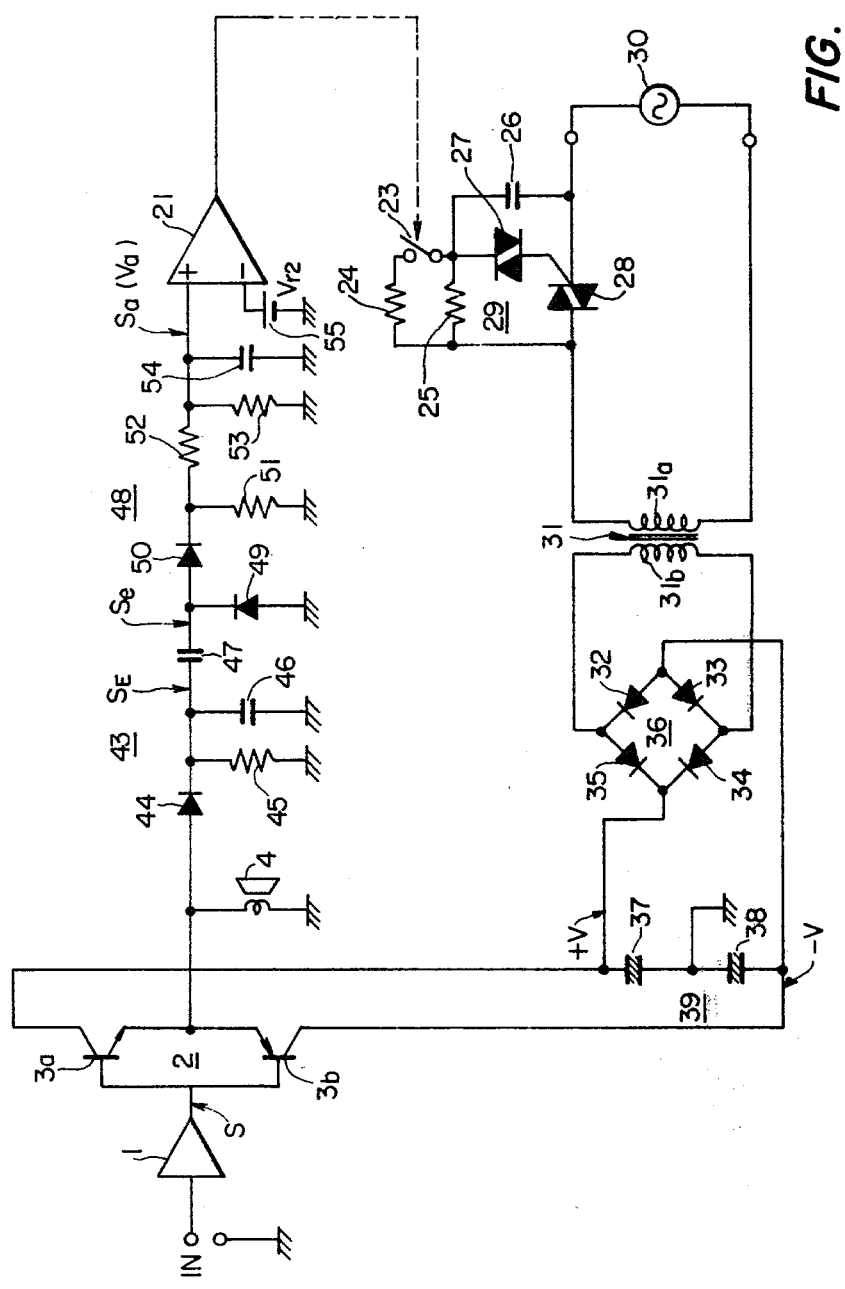
FIG. 5 is a circuit diagram showing another embodiment of the power amplifying circuit according to the present invention.

FIG. 5 shows another embodiment of the power amplifying circuit according to the present invention. Those elements and parts similar to those shown in FIG. 1 are assigned with similar reference numerals to omit their explanation for the purpose of simplicity. Reference numeral 43 represents an envelope detecting circuit, which is comprised of a diode 44, a resistor 45 and a capacitor 46. This envelope detecting circuit 43 detects, for the electric signal S, the envelope of the half wave of this signal, and outputs a corresponding envelope signal $S_E$. This envelope signal $S_E$ is passed through a capacitor 47 for cutting the dc component of this signal, and is applied to a mean value detecting circuit 48.

The mean value detecting circuit 48 is formed with voltage double rectifying diodes 49 and 50, resistors 51 to 53, and a capacitor 54. This detecting circuit 48 detects a mean level, with respect to the ac component, of the envelope waveshape of the input envelope signal $S_e$, and outputs a corresponding mean level signal $S_a$.

The voltage $V_a$ of this mean level signal $S_a$ is compared by the comparator 21 with a reference voltage $V_{r2}$ supplied by a reference voltage supply 55. When $V_a > V_{r2}$, a high level output is delivered to close the normally open contact 23 of the triggering circuit 29 of the bidirectional thyristor 28, to thereby advance the triggering phase angle of this bidirectional thyristor 28.

Figure 6:
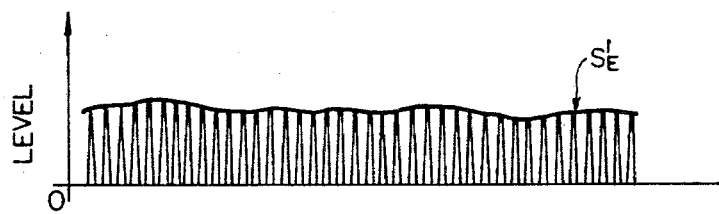
FIG. 6 is a diagram of waveshape of an envelope signal in FIG. 5 in case the electric signal has a waveshape similar to a sinusoidal wave.
Figure 7:
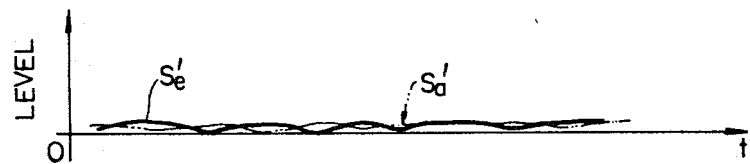
FIG. 7 is a diagram of waveshape of the mean level signal in FIG. 5 in case the electric signal has a waveshape similar to a sinusoidal wave.

Let us here suppose that the electric signal S being applied from the output of the drive circuit 1 is one having a gentle waveshape in the form of, for example, a sinusoidal wave, and that the waveshape of the output signal $S'_E$ of the envelope detecting circuit 43 is expressed as shown in FIG. 6. The variation of envelope of such envelope signal $S'_E$ as mentioned above is very small as illustrated. This signal $S'_E$ is passed through the capacitor 47 to be modified into a signal $S'_e$ (see FIG. 7), and is outputted as a signal $S'_a$ (shown by the chain line in FIG. 7) corresponding to the mean level of said signal $S'_e$. As will be clear from FIG. 7, the level of this mean level signal $S'_a$ is very low.

Figure 8:
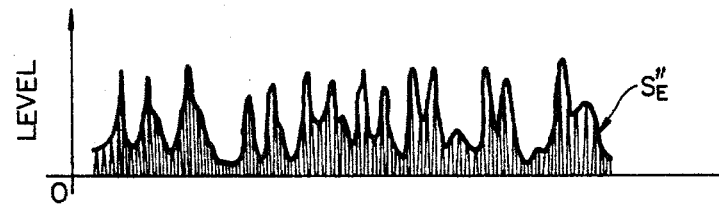
FIG. 8 is a diagram of waveshape of an envelope signal in FIG. 5 in case the electric signal has a pulsive waveshape.
Figure 9:
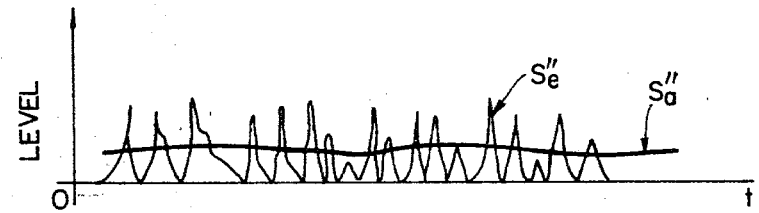
FIG. 9 is a diagram of waveshape of the mean level signal in FIG. 5 in case the electric signal has a pulsive waveshape.

On the other hand, let us now assume that the electric signal S to the power amplifying circuit 2 is one having a pulsive waveshape in the form of, for example, a musical signal, and that the waveshape of the output signal $S''_E$ of the envelope detecting circuit 43 is expressed as shown in FIG. 8. It will be noted that the variation of envelope of such envelope signal $S''_E$ is very great as shown. This signal $S''_E$ is deprived of its dc component by the capacitor 47, and is inputted as a signal $S''_e$ (see FIG. 9) into the mean value detecting circuit 48. This mean value detecting circuit 48 outputs a mean level signal $S''_a$ (see FIG. 9) corresponding to the mean level of the input signal $S''_e$. The level of this mean value signal $S''_a$ is very high as compared with the level of the aforesaid mean level signal $S'_a$.

Now, a crest factor of a signal is expressed by "maximum value"/"effective value". The effective value of the envelope signal $S''_E$ is smaller than the effective value of the envelope signal $S'_E$. Accordingly, in case the peak values of these two envelope signals $S''_E$ and $S'_E$ are equal to each other, the crest factor of the signal $S''_E$ will become very high as compared with the crest factor of the signal $S'_E$. In other words, the fact that the mean value of an envelope is high means that its crest factor is high. Similarly, the fact that the mean level of an envelope is low means that its crest factor is low. And, an electric signal whose envelope is expressed by a signal $S'_E$ provides a greater load for the power amplifying circuit 2 than does an electric signal whose envelope is expressed in the form of a signal $S''_E$. Accordingly, thermal losses of the power transistors 3a and 3b will also naturally become great. Also, with respect to an ordinary musical signal, the probability of occurrence of instances wherein the musical signal is such a continuous wave signal that its envelope is expressed by a signal $S'_E$ is very small. Accordingly, in case the electric signal is a musical signal, it will be understood that, even when the supply voltage for the power transistors 3a and 3b is set to a high level, the thermal loss can be suppressed to a very small level.

Thus, the predetermined reference voltage $V_{r2}$ which is applied to the comparator 21 is set to an appropriate value according to the difference between the mean level signal $S''_a$ and the mean level signal $S'_a$. And, in case the output signal of the mean value detecting circuit 48 is $S''_a$, i.e. in case the electric signal S is a pulsive signal like a musical signal, the output of the comparator 21 is made to be at a high level, thereby advancing the triggering phase angle of the bidirectional thyristor 28, to supply a high voltage to the power transistors 3a and 3b. Also, in case the output signal of the mean value detecting circuit 48 is $S'_a$, i.e. in case the electric signal has a gentle waveshape in the form of, for example, a sinusoidal wave, the triggering phase angle of the bidirectional thyristor 28 is retarded, so that a low voltage is supplied to the power transistors 3a and 3b.

As stated above, in case of an ordinary musical signal, thermal loss of the power transistors 3a and 3b is small in condition of being a high peak. Therefore, consideration has to be paid so that a voltage as high as possible is supplied to the power transistors to insure that a faithful reproduction is materialized, while in case of input of a gentle wave having a high mean level, the voltage to be supplied to the power transistors 3a and 3b is lowered, to minimize thermal losses.

In the power amplifying circuit described in connection with FIG. 5, arrangement is provided so that the phase angle of triggering of the bidirectional thyristor 28 is controlled in two stages, i.e. the advanced phase angle and the retarded phase angle, in a manner similar to the instance of the power amplifying circuit described previously by referring to FIG. 1. It should be understood, however, that arrangement may be made so that the output signal of the mean value detecting circuit 48 is inputted to the differential amplifier which is given a reference voltage, and thus, in a same way as that described with respect to FIG. 4, the triggering phase angle of the bidirectional thyristor 28 is varied continuously by the output signal of this differential amplifier, whereby the dc supply voltage for the power transistors of the power amplifying circuit can be varied continuously.

What is claimed is:

1. A power amplifying circuit, comprising:
   a power amplifying element for amplifying an input electrical signal thereto;
   detecting means for detecting a crest factor of a waveshape of an input signal amplified by said power amplifying element, the crest factor being proportional to the difference between a peak value of the input signal and a mean value of the input signal and providing a crest factor signal indicative thereof; and
   controlling means for controlling a supply voltage for the power amplifying element of said power amplifying circuit in response to the crest factor signal such that the supply voltage (a) elevates as the crest factor becomes larger and (b) lowers as the crest factor becomes smaller.

2. A power amplifying circuit according to claim 1, in which:
   said crest factor detecting means comprises a peak-value detecting circuit for detecting a peak value of said electric signal, a mean-value detecting circuit for detecting a mean value of said electric signal, and differential signal detecting means for detecting a difference between an output signal of said peak value detecting circuit and an output of said mean value detecting circuit and providing a signal representing said crest factor.

3. A power amplifying circuit according to claim 2, in which:
   said peak value detecting circuit is comprised of a diode for inhibiting a reverse-current flow and a capacitor for integrating an output of said diode.

4. A power amplifying circuit according to claim 2, in which:
   said mean value detecting circuit comprises a diode for inhibiting a reverse-current flow, voltage dividing resistors connected to said diode to produce a voltage-divided output, and a capacitor for integrating said voltage-divided output.

5. A power amplifying circuit according to claim 2, in which:
   said differential signal detecting means comprises a differential amplifier for delivering an output to continuously control said controlling means.

6. A power amplifying circuit according to claim 2, in which:
   said differential signal detecting means comprises a differential amplifier, and
   said power amplifying circuit further comprises a comparator having a first input connected to an output side of said differential amplifier and a second input adapted adapted to receive a reference voltage and being operative so that, (a) when an output signal of said differential amplifier is of a level exceeding said reference voltage, it switches said controlling means for use in supplying a high voltage to said power amplifying element, and (b) when said output signal is lower in level than said reference voltage, it switches the controlling means for use in supplying a low voltage to the power amplifying element.

7. A power amplifying circuit comprising:
   a power amplifying element for amplifying an input electric signal coupled to an input thereof;
   detecting means for detecting a crest factor of a waveshape of the amplified input signal, the detecting means comprising a peak value detecting circuit for detecting a peak value of the electric signal, a mean-value detecting circuit for detecting a mean value of the electric signal and differential signal detecting means for detecting a difference between an output signal of the peak value detecting circuit and an output of the mean value detecting circuit and providing a signal representing the crest factor; and
   controlling means for controlling a supply voltage for the power amplifying element of said power amplifying circuit as a function of the detected crest factor, the voltage being elevated when the crest factor is great and lowered when the crest factor is small, the controlling means comprising a phase controlling means for performing phase control of an AC voltage to provide a phase-controlled AC voltage, rectifying means for rectifying via a power transformer said phase controlled AC voltage, and smoothing means for smoothing an output of said rectifying means and supplying an output voltage to the power amplifying elements.

8. A power amplifying circuit according to claim 7, in which:
   said phase controlling means comprises a bidirectional thyristor and a triggering circuit for triggering said bidirectional thyristor and adapted to be controlled by an output signal of said differential signal detecting means.

9. A power amplifying circuit according to claim 1, in which:
   said means for detecting a crest factor comprises an envelope detecting circuit for detecting an envelope of said electric signal, a capacitor for extracting only an ac component from an output signal of said envelope detecting circuit, and a mean value detecting circuit for detecting a mean value of an output signal from said capacitor and for delivering an output to be inputted, as a signal representing said crest factor, to said controlling means.

10. A power amplifying circuit according to claim 9, in which:
    said envelope detecting circuit comprises a diode for inhibiting a reverse-current flow, a capacitor for integrating an output of said diode, and a resistor connected in parallel to said capacitor.

11. A power amplifying circuit according to claim 9, in which:
    said mean value detecting circuit comprises a rectifying diode, voltage-dividing resistors connected to said diode to produce a voltage-divided output, and a capacitor for storing said voltage-divided output.

12. A power amplifying circuit according to claim 9, further comprising:
    a comparator connected to an output side of said mean value detecting circuit and adapted for being applied with a reference voltage and being operative so that, when an output signal of said mean value detecting circuit exceeds in level said reference voltage, it switches said controlling means for use in supplying a high voltage to said power amplifying elements, and that, when said output signal is lower in level than said reference voltage, it switches the controlling means for use in supplying a low voltage for the power amplifying elements.

13. A power amplifying circuit according to claim 9, further comprising:
a differential amplifier connected to an output side of said mean-value detecting circuit and adapted to be applied with a reference voltage and being operative so that said controlling means is controlled continuously by an output of said differential amplifier.

14. A power amplifying circuit comprising:
a power amplifying element for amplifying an input electric signal thereto;
detecting means for detecting a crest factor of a wave shape of an amplified input signal, the detecting means comprising an envelope detecting circuit for detecting an envelope of the input electric signal, a capacitor for extracting only an AC component from an output signal of the envelope detecting circuit and a mean value detecting circuit for detecting a mean value of an output signal from the capacitor and for providing an output to be inputted as a signal representing the crest factor;
controlling means adapted to receive said signal representing said crest factor from said detecting means, for controlling responsive thereto a supply voltage for the power amplifying element of said power amplifying circuit as a function of the detected crest factor, the voltage being elevated when the crest factor is great and lowered when the crest factor is small, the controlling means comprising phase controlling means for performing phase control of an AC voltage to provide a phase controlled AC voltage, rectifying means for rectifying via a power transformer the phase controlled AC voltage, and smoothing means for smoothing an output of the rectifying means and supplying an output voltage to the power amplifying element.

15. A power amplifying circuit according to claim 14, in which:
said phase-controlling means comprises a bidirectional thyristor, and a triggering circuit for triggering this bidirectional thyristor and adapted to be controlled by an output signal of said mean-value detecting circuit.

* * * * *